(12) United States Patent
Qian et al.

(10) Patent No.: US 12,146,930 B2
(45) Date of Patent: Nov. 19, 2024

(54) MAGNETIC RESONANCE SYSTEM

(71) Applicant: SHANGHAI UNITED IMAGING HEALTHCARE CO., LTD., Shanghai (CN)

(72) Inventors: Jin Qian, Shanghai (CN); Shuguang Liu, Shanghai (CN); Bo Li, Shanghai (CN); Xing'en Yu, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 140 days.

(21) Appl. No.: 17/932,287

(22) Filed: Sep. 14, 2022

(65) Prior Publication Data
US 2023/0077345 A1 Mar. 16, 2023

(30) Foreign Application Priority Data
Sep. 14, 2021 (CN) .......................... 202122214631.1

(51) Int. Cl.
*G01R 33/3873* (2006.01)
*G01R 33/34* (2006.01)
*G01R 33/385* (2006.01)

(52) U.S. Cl.
CPC ..... *G01R 33/3873* (2013.01); *G01R 33/3403* (2013.01); *G01R 33/385* (2013.01)

(58) Field of Classification Search
CPC ............ G01R 33/3873; G01R 33/3403; G01R 33/385; G01R 33/3804; G01R 33/3815; G01R 33/4215
See application file for complete search history.

(56) References Cited

U.S. PATENT DOCUMENTS

2012/0098538 A1* 4/2012 Shen .................. G01R 33/3873 324/318
2015/0346294 A1* 12/2015 Nogami ............. G01R 33/3873 324/322

* cited by examiner

*Primary Examiner* — G. M. A Hyder
(74) *Attorney, Agent, or Firm* — METIS IP LLC

(57) ABSTRACT

The present disclosure may provide a magnetic resonance (MR) system. The MR system may include a magnet assembly, a gradient coil assembly, and a shim assembly. The magnet assembly may be configured to generate a main magnetic field. The magnet assembly may include a magnet and a cryostat configured to cool the magnet located inside the cryostat. The cryostat may form a bore. The gradient coil assembly may be configured to generate a gradient magnetic field. The gradient coil assembly may be located inside the bore. The shim assembly may be configured to at least partially shield a stray field which is generated by the gradient coil assembly and to which the magnet is subjected. The shim assembly may be located outside the gradient coil assembly.

20 Claims, 10 Drawing Sheets

600

MAGNETIC RESONANCE SYSTEM

CROSS-REFERENCE TO RELATED APPLICATIONS

This application claims priority to Chinese Patent Application No. 202122214631.1, filed on Sep. 14, 2021, the contents of which are hereby incorporated by reference.

TECHNICAL FIELD

The present disclosure generally relates to imaging, and more particularly, relates to a magnetic resonance imaging (MRI) system.

BACKGROUND

A magnetic resonance (MR) system may utilize interaction between magnetic fields and nuclear spins inside an object (e.g., a patient) to generate an image of the object. The magnetic fields may include a main magnetic field generated by a main magnet (e.g., a superconducting magnet) and a gradient field generated by a gradient coil. However, the gradient coil may also generate a stray field to which the main magnet is subjected, which may cause an eddy current in the main magnet. A temperature of the main magnet may increase due to heat generated by the eddy current, causing more consumption of a cooling medium for cooling the main magnet and/or a quench of the main magnet.

SUMMARY

Some embodiments of the present disclosure may provide a magnetic resonance (MR) system. The MR system may include a magnet assembly, a gradient coil assembly, and a shim assembly. The magnet assembly may be configured to generate a main magnetic field. The magnet assembly may include a magnet and a cryostat configured to cool the magnet located inside the cryostat. The cryostat may form a bore. The gradient coil assembly may be configured to generate a gradient magnetic field. The gradient coil assembly may be located inside the bore. The shim assembly may be configured to at least partially shield a stray field which is generated by the gradient coil assembly and to which the magnet is subjected. The shim assembly may be located outside the gradient coil assembly.

In some embodiments, the cryostat may include a thermal shield layer, and the magnet may be located in a chamber enclosed by the thermal shield layer.

In some embodiments, the shim assembly may be located on an outer wall of the cryostat.

In some embodiments, the shim assembly may be located between the gradient coil assembly and the cryostat.

In some embodiments, the shim assembly may be located on an outer surface of the gradient coil assembly.

In some embodiments, the gradient coil assembly may include a primary coil unit and a secondary coil unit. The secondary coil unit may be located between the primary coil unit and the shim assembly. A gap may exist between the secondary coil unit and the shim assembly.

In some embodiments, the shim assembly may include a plurality of shim components and a plurality of mounting components configured to support the plurality of shim components.

In some embodiments, each of the plurality of mounting components may be configured to support a corresponding shim component of the plurality of shim components.

In some embodiments, each of at least one of the plurality of shim components may include an accommodating piece and a shim piece. The accommodating piece may be configured to enclose at least a portion of the shim piece.

In some embodiments, a ratio of a length of the accommodating piece to a length of the bore along an axial direction of the bore may be larger than or equal to a ratio threshold.

In some embodiments, the ratio threshold may be $1/3$.

In some embodiments, the accommodating piece may be made of a non-metallic material.

In some embodiments, the mounting component may include a mounting hole.

In some embodiments, the mounting component may include a mounting bracket. The mounting bracket and an inner wall of the bore may form a space for housing the corresponding shim component.

In some embodiments, the mounting bracket may include a connection piece extending along an axial direction of the bore and a limiting piece. The connection piece may be connected to the inner wall of the bore. The limiting piece may be located on the connection piece. The limiting piece may be configured to limit a movement of the corresponding shim component.

In some embodiments, the cryostat may include a thermosiphon or a material of thermal conductivity configured to cool the magnet.

Some embodiments of the present disclosure may provide a magnetic resonance (MR) system. The MR system may include a magnet assembly, a cooling channel, a refrigeration component, and a shim assembly. The magnet assembly may be configured to generate a magnetic field. The magnet assembly may include a superconducting coil unit and a cryostat configured to cool the superconducting coil unit located inside the cryostat. The cryostat may form a bore. The cooling channel may be located around the superconducting coil unit. The cooling channel may be configured to accommodate a cooling medium. The refrigeration component may be located on the cryostat and thermally coupled to the cooling channel. The shim assembly may be configured to at least partially shield a stray field which is generated by the gradient coil assembly and to which the magnet is subjected. The shim assembly may be located on or outside the cryostat.

In some embodiments, the MR system may further include a gradient coil assembly located inside the bore. The gradient coil assembly may include a primary coil unit and a secondary coil unit. The secondary coil unit may be located between the primary coil unit and the shim assembly. A gap may exist between the secondary coil unit and the shim assembly.

Some embodiments of the present disclosure may provide a magnetic resonance (MR) system. The MR system may include a magnet assembly, a refrigeration component, a gradient coil assembly, and a shim assembly. The magnet assembly may be configured to generate a main magnetic field. The magnet assembly may include a superconducting coil unit and a cryostat configured to cool the superconducting coil unit located inside the cryostat. The cryostat may form a bore. The refrigeration component may be located on the cryostat and thermally coupled to the magnet assembly. The gradient coil assembly may be configured to generate a gradient magnetic field. The gradient coil assembly may be located inside the bore. The shim assembly may be configured to at least partially shield a stray field which is generated by the gradient coil assembly and to which the magnet is subjected. The shim assembly may be located outside the gradient coil assembly.

In some embodiments, the shim assembly may include a plurality of shim components distributed along a circumferential direction of the gradient coil assembly. Each of at least one of the plurality of shim components may include a shim piece and an accommodating piece configured to accommodate the shim piece.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings.

The drawings are not to scale. These embodiments are non-limiting exemplary embodiments, in which like reference numerals represent similar structures throughout the several views of the drawings, and wherein.

DETAILED DESCRIPTION

Figure 1:
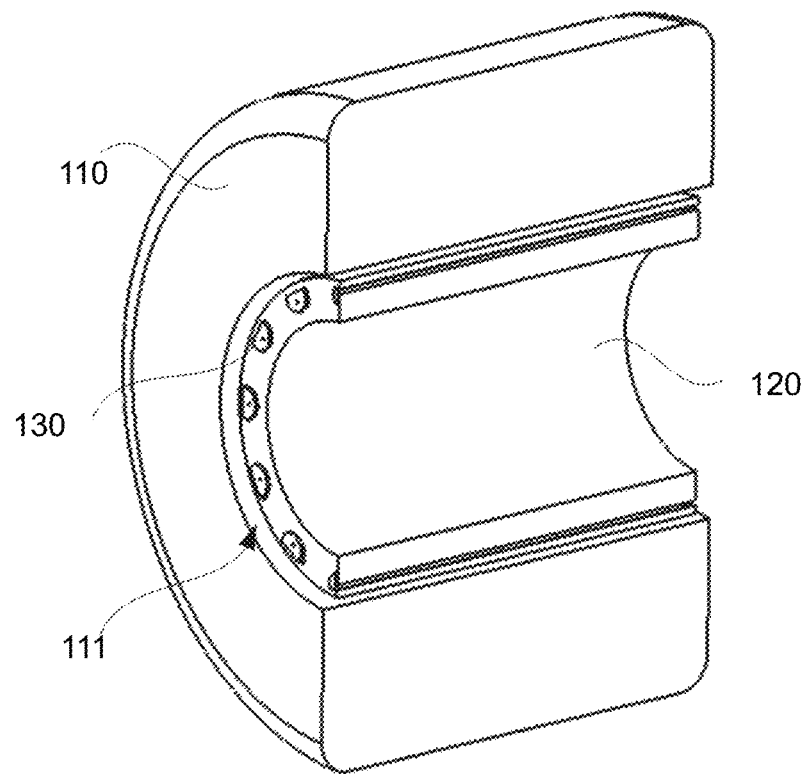
FIG. 1 is a schematic diagram illustrating an existing MR scanner.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

As used herein, the term "and/or" includes any and all combinations of one or more of the associated listed items. In the present disclosure, unless otherwise expressly specified, the terms "mount," "connect," "couple," "fix," etc., should be understood in a broad sense, for example, it may be a fixed connection, a detachable connection, integrated into a whole, a mechanical connection, an electrical connection, directly connected, or indirectly connected via an intermediate medium, an internal connection of two elements, or an interconnection of two elements. For those skilled in the art, the specific meanings of the above terms in the present disclosure may be understood according to specific circumstances.

In the present disclosure, spatial reference terms such as "center," "longitudinal," "transverse," "length," "width," "thickness," "upper," "lower," "front," "back," "left," "right," "vertical," "horizontal," "top," "bottom," "inner," "outer," "clockwise," "counterclockwise," "axial," "radial," "circumferential," etc., indicate, in a relative sense, an orientation or positional relationship between two or more elements, assemblies, devices, or systems based on an orientation or positional relationship as shown in the drawings, and are only for the convenience and simplicity of description, rather than indicating or implying that the elements, assemblies, devices, or systems in the present disclosure have a particular orientation when the disclosed system, or a portion thereof, is in operation, or are constructed and operated in a particular orientation, and therefore should not be understood as a limitation of the present disclosure.

In the present disclosure, unless expressly stated otherwise, a first feature being "above" or "below" a second feature may be that the first feature and the second feature are in direct contact, or the first feature and the second feature may be in indirect contact via an intermediate medium. In some embodiments, the first feature being "above" or "on" the second feature may mean that the first feature is directly above or obliquely above the second feature, or simply mean that a horizontal height of the first feature is higher than a horizontal height of the second feature. The first feature being "below" or "underneath" the second feature may mean that the first feature is directly below or obliquely below the second feature, or it may simply mean that a horizontal height of the first feature is smaller than a horizontal height of the second feature.

It will be understood that, although the terms "first," "second," "third," etc., may be used herein to distinguish one element from another. For example, a first element may be termed a second element, and similarly, a second element may be termed a first element, without departing from the scope of exemplary embodiments of the present disclosure.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnet resonance imaging system, a non-superconducting magnet resonance imaging system, etc. The multi-modality imaging system may include, for example, a magnetic resonance-computed tomography imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on an object. The treatment device may include an accelerator of species of particles including, for example, photons, electrons, protons, or heavy ions. The imaging device may include an MR scanner.

FIG. 1 is a schematic diagram illustrating an existing MR scanner according to some embodiments of the present disclosure. The MR scanner 100 may include a magnet assembly 110, a gradient coil assembly 120, and a shim assembly 130. The gradient coil assembly 120 and the shim assembly 130 may be located inside a bore 111 of the magnet assembly 110. The magnet assembly 110 may generate a main magnetic field. The magnet assembly 110 may include a superconducting coil unit (not shown in FIG. 1) and a refrigeration component (not shown in FIG. 1). The superconducting coil unit may generate the main magnetic field. The refrigeration component may cool the superconducting coil unit.

In some cases, the gradient coil assembly 120 may include a primary coil unit (not shown in FIG. 1) for generating the gradient field. The primary coil unit may also generate a stray field to which the magnet assembly 110 is subjected, which may cause an eddy current in the magnet assembly 110. The temperature of the magnet assembly 110 may increase due to heat generated by the eddy current. If the magnet assembly 110 fails to be cooled timely, a quench of the magnet assembly 110 may occur. Ways of avoiding the problems may include reducing the intensity of the stray field, increasing the cooling capacity of the refrigeration component, etc.

In some cases, the gradient coil assembly 120 may include a secondary coil unit (not shown in FIG. 1) for shielding the primary coil unit so as to at least partially prevent or reduce the interference of the magnet assembly 110 by the stray field.

The shim assembly 130 may be located between the primary coil unit and the magnet assembly 110. The shim assembly 130 may shield at least a portion of the stray field, reducing the eddy current in the magnet assembly 110 caused by the stray field. To this end, the shim assembly 130 may at least partially compensate for the stray field. The shim assembly 130 may be configured to improve homogeneity of the main magnetic field. In some cases, the larger a power of a gradient sequence of the primary coil unit is, the more heat generated by the eddy current may be. Therefore, the intensity of the stray field may be reduced by arranging the secondary coil unit and/or the shim assembly 130, and/or reducing the power of the gradient sequence of the primary coil unit.

As shown in FIG. 1, the shim assembly 130 may be located inside the gradient coil assembly 120. The shim assembly 130 may be located between the secondary coil unit and the primary coil unit. The shim assembly 130 may be located inside a plurality of mounting holes that are along a circumferential direction of the gradient coil assembly 120. However, since the shim assembly 130 is located between the secondary coil unit and the primary coil unit, the secondary coil unit may be spaced apart from the primary coil unit by the shim assembly 130, which may negatively affect the shielding effect of the stray field by the secondary coil unit. Therefore, in order to efficiently shield the primary coil unit so as to reduce the interference of the magnet in the magnet assembly by the stray field and thereby avoiding a quench of the magnet assembly 120 in the existing MR system 100, the cooling capacity of the refrigeration component may need to be increased, which may increase the consumption of a cooling medium (e.g., helium) and/or an electrical power for operating the refrigeration component. Additionally or alternatively, the power of the gradient sequence of the primary coil unit may need to be limited or restricted, which may limit the utilization range of the existing MR system 100.

Besides, during operation, the primary coil unit may be heated, the temperature of the gradient coil assembly 120 may increase, and the property (e.g., a conductivity) of the shim assembly 130 may change, which may negatively affect the shimming effect of the shim assembly 130 located inside the gradient coil assembly 120, thereby negatively affecting the homogeneity of the main magnetic field. In some embodiments, the larger the total mass of the shim assembly 130 is, the more the change of the property of the shim assembly 130 may be. Therefore, the total mass of the shim assembly 130 may need to be limited or restricted, which may in turn limit the shimming effect of the shim assembly 130.

In order to solve the problems illustrated above, some embodiments of the present disclosure may provide an MR system. The MR system may include a magnet assembly, a gradient coil assembly, and a shim assembly. The magnet assembly may be configured to generate a main magnetic field (e.g., a main magnetic field as described with reference to FIG. 3). The gradient coil assembly may be configured to generate a gradient magnetic field (e.g., a gradient field as described with reference to FIG. 3). The shim assembly may be configured to compensate for inhomogeneity of at least one of the main magnetic field or the gradient magnetic field. The shim assembly may be located outside the gradient coil assembly. Compared to the existing MR system 100 as illustrated in FIG. 1 in which the shim assembly is located within the gradient coil assembly (e.g., between the secondary coil unit and the primary coil unit), by locating the shim assembly outside the gradient coil assembly, the secondary coil unit may be closer to the primary coil unit, thereby improving the shielding effect with respect to the stray field towards the magnet. Besides, since the secondary coil unit may shield the stray field more effectively, the consumption of a cooling medium (e.g., helium) and/or an electrical power for operating a refrigeration component for cooling the magnet may be reduced. Additionally or alternatively, the restriction on the power of a gradient sequence of the primary coil unit due to the cooling capacity and/or cooling medium usage of the refrigeration component of the MR system may be alleviated, enlarging a utilization range and/or improving a scanning efficiency of the MR system.

In addition, compared to the existing MR system 100, by locating the shim assembly outside the gradient coil assembly according to embodiments of the present disclosure, the impact of an increased temperature of the gradient coil assembly during an operation of the primary coil unit on the shim assembly may be reduced, such that the shim assembly may maintain its efficiency in compensating for the inhomogeneity of the main magnetic field. Besides, the restriction on the total mass of the shim assembly may be alleviated, such that the shimming effect of the shim assembly may be increased by increasing the total weight of the shim assembly.

In addition, compared to the existing MR system 100, by locating the shim assembly outside the gradient coil assembly according to embodiments of the present disclosure, a size (e.g., an outer diameter) of the gradient coil assembly may reduce. Due to factors including, e.g., the reduced size of and lack of the shim assembly in the gradient coil assembly, the manufacture and/or maintenance of the gradient coil assembly may be simplified.

Figure 2:
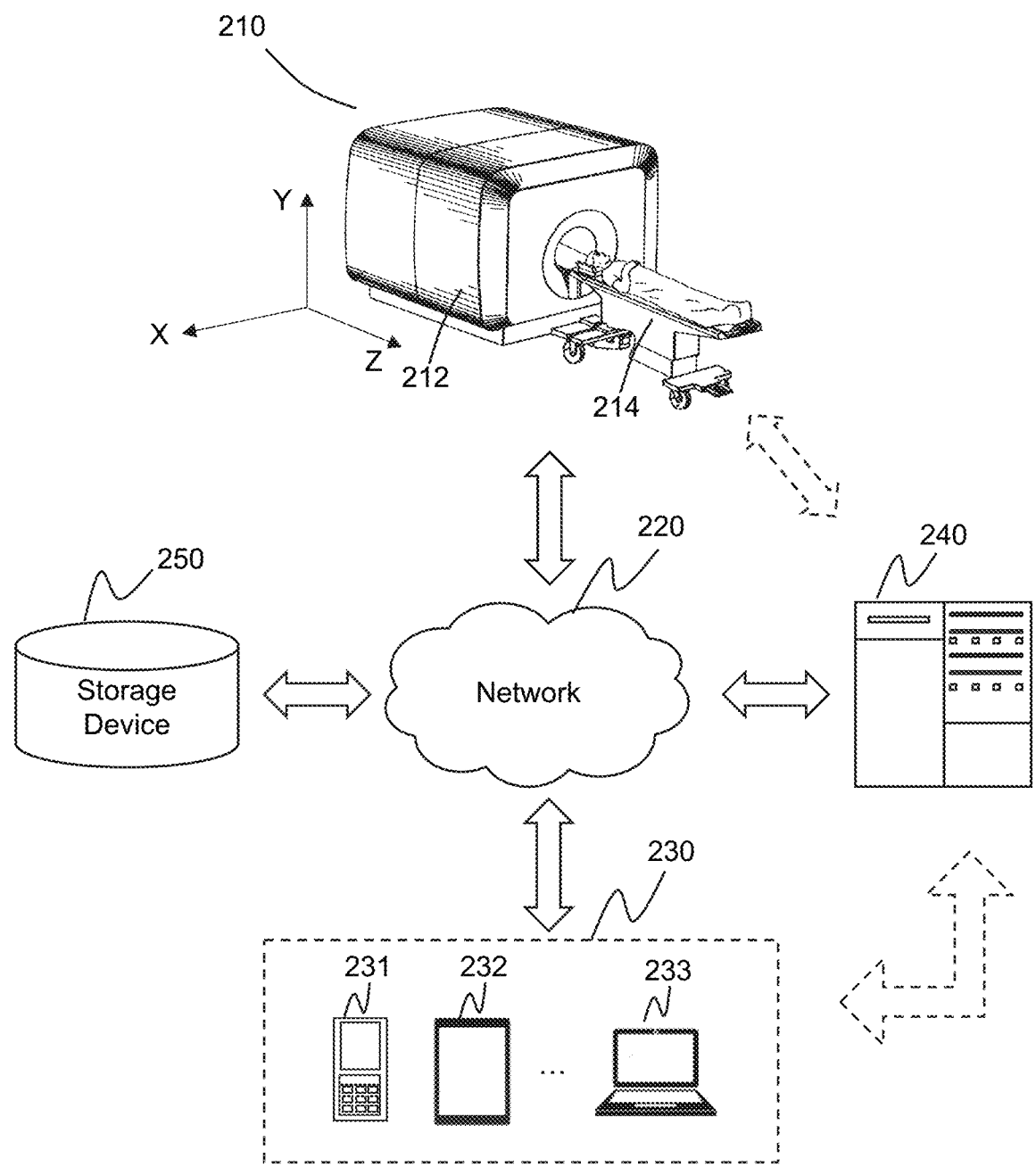
FIG. 2 is a schematic diagram illustrating an exemplary MR system according to some embodiments of the present disclosure.

FIG. 2 is a schematic diagram illustrating an exemplary MR system 200 according to some embodiments of the present disclosure. As illustrated, the MR system 200 may include an MR scanner 210, a network 220, a terminal 230, a processing device 240, and a storage device 250. The components of the MR system 200 may be connected in one or more of various ways. Merely by way of example, as illustrated in FIG. 2, the MR scanner 210 may be connected to the processing device 240 through the network 220. As another example, the MR scanner 210 may be connected to the processing device 240 directly (as indicated by the bi-directional arrow in dotted lines linking the MR scanner 210 and the processing device 240). As a further example, the storage device 250 may be connected to the processing device 240 directly or through the network 220. As still a further example, a terminal device (e.g., 231, 232, 233, etc.) may be connected to the processing device 240 directly (as indicated by the bi-directional arrow in dotted lines linking the terminal 230 and the processing device 240) or through the network 220.

The MR scanner 210 may scan an object located within its detection region and generate data relating to the object. In the present disclosure, "subject" and "object" are used interchangeably. Merely by way of example, the object may include a patient, a man-made object, etc. As another example, the object may include a specific portion, organ, and/or tissue of a patient. For example, the object may include head, brain, neck, body, shoulder, arm, thorax, cardiac, stomach, blood vessel, soft tissue, knee, feet, or the like, or any combination thereof. In some embodiments, the MR scanner 210 may be a close-bore scanner or an open-bore scanner.

In the present disclosure, the X-axis, the Y-axis, and the Z-axis shown in FIG. 2 may form an orthogonal coordinate system. The X-axis and the Z-axis shown in FIG. 2 may be horizontal, and the Y-axis may be vertical. As illustrated, the positive X-direction along the X-axis may be from the right side to the left side of the MR scanner 210 seen from the direction facing the front of the MR scanner 210; the positive Y-direction along the Y-axis shown in FIG. 2 may be from the lower part to the upper part of the MR scanner 210; the positive Z-direction along the Z-axis shown in FIG. 2 may refer to a direction in which the object is moved out of the detection region (or referred to as the bore) of the MR scanner 210. More descriptions of the MR scanner 210 may be found elsewhere in the present disclosure. See, e.g., FIG. 3 and the description thereof.

In some embodiments, the MR scanner 210 may include a gantry 212 and a patient support 214 (e.g., along the Z-direction). In some embodiments, the gantry 212 may be configured to support magnets (e.g., the main magnet 301 in FIG. 3), coils (e.g., the gradient coils 302 and/or the radio frequency (RF) coils 303 in FIG. 3), etc. The gantry 212 may surround, along the Z-direction, the object that is moved into or located within the detection region. In some embodiments, the patient support 214 may be configured to support the object. In some embodiments, the patient support 214 may have 6 degrees of freedom, for example, three translational degrees of freedom along three coordinate directions (i.e., X-direction, Y-direction, and Z-direction) and three rotational degrees of freedom around the three coordinate directions. Accordingly, the object may be positioned by the patient support 214 within the detection region. Merely by way of example, the patient support 214 may move the object into the detection region along the Z-direction in FIG. 2.

The network 220 may include any suitable network that can facilitate the exchange of information and/or data for the MR system 200. In some embodiments, one or more components of the MR system 200 (e.g., the MR scanner 210, the terminal 230, the processing device 240, or the storage device 250) may communicate information and/or data with one or more other components of the MR system 200 via the network 220. For example, the processing device 240 may obtain signals of an RF pulse from the MR scanner 210 via the network 220. In some embodiments, the network 220 may be any type of wired or wireless network, or a combination thereof.

The terminal 230 may include a mobile device 231, a tablet computer 232, a laptop computer 233, or the like, or any combination thereof. In some embodiments, the mobile device 231 may include a smart home device, a wearable device, a smart mobile device, a virtual reality device, an augmented reality device, or the like, or any combination thereof. In some embodiments, the terminal 230 may remotely operate the MR scanner 210 and/or the processing device 240. In some embodiments, the terminal 230 may operate the MR scanner 210 and/or the processing device 240 via a wireless connection. In some embodiments, the terminal 230 may receive information and/or instructions inputted by a user, and send the received information and/or instructions to the MR scanner 210 or to the processing device 240 via the network 220. In some embodiments, the terminal 230 may receive data and/or information from the processing device 240. In some embodiments, the terminal 230 may be part of the processing device 240. In some embodiments, the terminal 230 may be omitted.

The processing device 240 may process data and/or information obtained from the MR scanner 210, the terminal 230, and/or the storage device 250. For example, the processing device 240 may process an MR signal generated by the MR scanner 210 and encode the MR signal for generating an image (e.g., a two-dimensional (2D) image, a three-dimensional (3D) image). In some embodiments, the processing device 240 may be a single server, or a server group. The server group may be centralized or distributed. In some embodiments, the processing device 240 may be local or remote. In some embodiments, the processing device 240 may be implemented on a cloud platform.

The storage device 250 may store data and/or instructions. In some embodiments, the storage device 250 may store data obtained from the MR scanner 210, the terminal 230, and/or the processing device 240. For example, the storage device 250 may store an MR signal generated by the MR scanner 210. In some embodiments, the storage device 250 may store data and/or instructions that the processing device 240 may execute or use to perform exemplary methods described in the present disclosure. For example, the storage device 250 may store instructions that the processing device 240 may execute to process an MR signal generated by the MR scanner 210 and encode the MR signal for generating an image. In some embodiments, the storage device 250 may include a mass storage device, a removable storage device, a volatile read-and-write memory, a read-only memory (ROM), or the like, or any combination thereof. In some embodiments, the storage device 250 may be implemented on a cloud platform.

In some embodiments, the storage device 250 may be connected to the network 220 to communicate with one or more components of the MR system 200 (e.g., the MR scanner 210, the processing device 240, the terminal 230, etc.). One or more components of the MR system 200 may access the data or instructions stored in the storage device 250 via the network 220. In some embodiments, the storage device 250 may be part of the processing device 240.

In some embodiments, the MR system 200 may further include one or more power supplies (not shown in FIG. 2) operably connected to one or more components of the MR system 200 (e.g., the MR scanner 210, the processing device 240, the terminal 230, the storage device 250, etc.).

Figure 3:
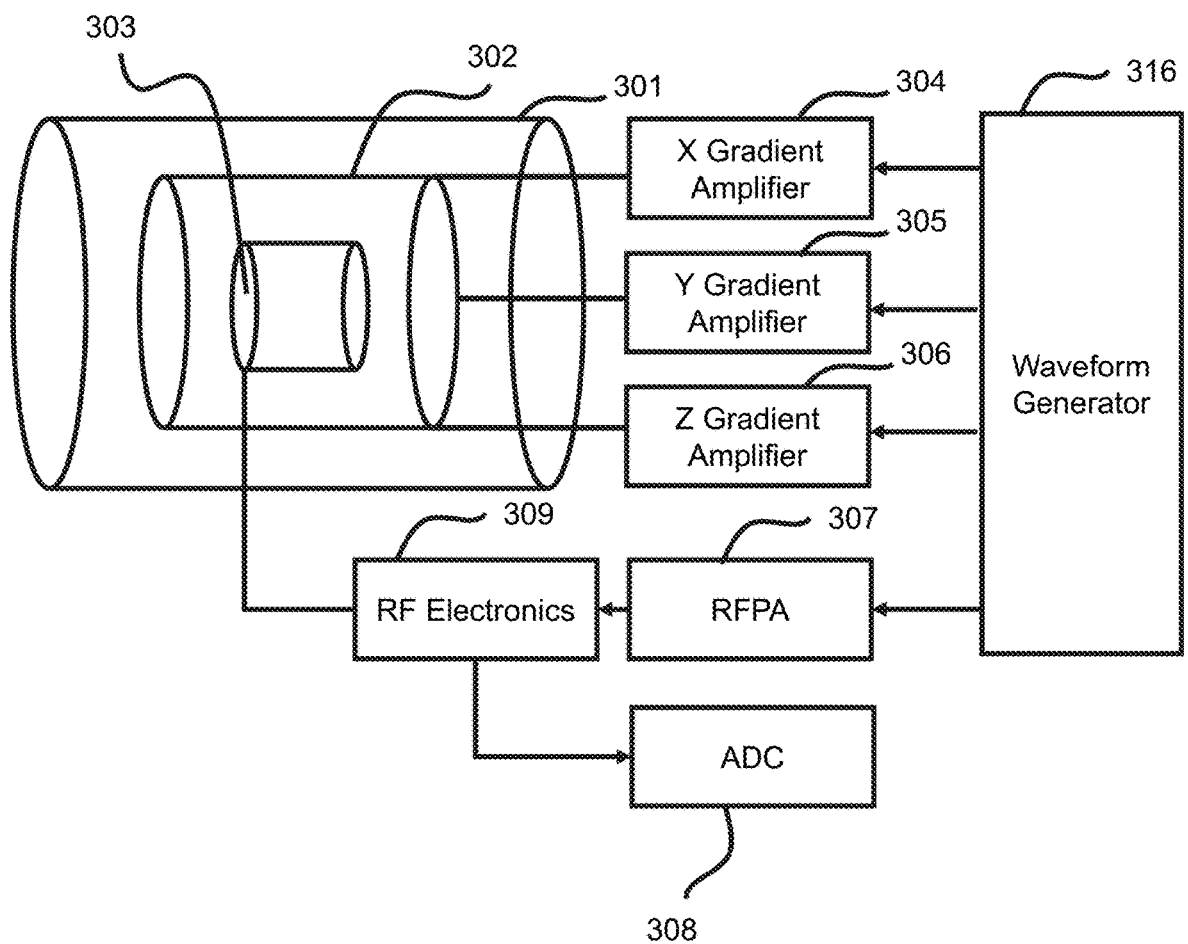
FIG. 3 is a schematic diagram illustrating an exemplary MR scanner according to some embodiments of the present disclosure.

FIG. 3 is a schematic diagram illustrating an exemplary MR scanner 210 according to some embodiments of the present disclosure.

As illustrated, the main magnet 301 may generate a main magnetic field that may be applied to an object (also referred to as a subject) positioned inside the main magnetic field. The main magnet 301 may include a resistive magnet or a superconductive magnet that both need a power supply (not shown in FIG. 3) for operation. Alternatively, the main magnet 301 may include a permanent magnet. The main magnet 301 may form the detection region and surround, along the Z-direction, the object that is moved into or positioned within the detection region. The main magnet 301 may also control the homogeneity of the generated main magnetic field. Some shim coils may be in the main magnet 301. The shim coils placed in the gap of the main magnet 301 may compensate for the inhomogeneity of the magnetic field of the main magnet 301. The shim coils may be energized by a shim power supply.

Gradient coils 302 may be located inside the main magnet 301. For example, the gradient coils 302 may be located in the detection region. The gradient coils 302 may surround, along the Z-direction, the object that is moved into or positioned within the detection region. The gradient coils 302 may be surrounded by the main magnet 301 around the Z-direction, and be closer to the object than the main magnet 301. The gradient coils 302 may generate a gradient magnetic field (including gradient fields Gx, Gy, and Gz). The gradient magnetic field may be superimposed on the main magnetic field generated by the main magnet 301 and distort the main magnetic field so that the magnetic orientations of the protons of an object may vary as a function of their positions inside the gradient field, thereby encoding spatial information into MR signals generated by the region of the object being imaged. The gradient coils 302 may include X coils (e.g., configured to generate the gradient field Gx corresponding to the X-direction), Y coils (e.g., configured to generate the gradient field Gy corresponding to the Y-direction), and/or Z coils (e.g., configured to generate the gradient field Gz corresponding to the Z-direction) (not shown in FIG. 3). The three sets of coils may generate three different magnetic fields that are used for position encoding. The gradient coils 302 may allow spatial encoding of MR signals for image reconstruction. The gradient coils 302 may be connected to one or more of an X gradient amplifier 304, a Y gradient amplifier 305, or a Z gradient amplifier 306. One or more of the three amplifiers may be connected to a waveform generator 316. The waveform generator 316 may generate gradient waveforms that are applied to the X gradient amplifier 304, the Y gradient amplifier 305, and/or the Z gradient amplifier 306. An amplifier may amplify a waveform. An amplified waveform may be applied to one of the coils in the gradient coils 302 to generate a magnetic field in the X-axis, the Y-axis, or the Z-axis, respectively. The gradient coils 302 may be designed for either a close-bore MR scanner or an open-bore MR scanner. In some instances, all three sets of coils of the gradient coils 302 may be energized and three gradient fields may be generated thereby. In some embodiments, the X coils and Y coils may be energized to generate the gradient fields in the X-direction and the Y-direction. As used herein, the X-axis, the Y-axis, the Z-axis, the X-direction, the Y-direction, and the Z-direction in the description of FIG. 3 are the same as or similar to those described in FIG. 2.

In some embodiments, radio frequency (RF) coils 303 may be located inside the main magnet 301 and serve as transmitters, receivers, or both. For example, the RF coils 303 may be located in the detection region. The RF coils 303 may surround, along the Z-direction, the object that is moved into or positioned within the detection region. The RF coils 303 may be surrounded by the main magnet 301 and/or the gradient coils 302 around the Z-direction, and be closer to the object than the gradient coils 302. The RF coils 303 may be in connection with RF electronics 309 that may be configured or used as one or more integrated circuits (ICs) functioning as a waveform transmitter and/or a waveform receiver. The RF electronics 309 may be connected to a radiofrequency power amplifier (RFPA) 307 and an analog-to-digital converter (ADC) 308.

When used as transmitters, the RF coils 303 may generate RF signals that provide a third magnetic field that is utilized to generate MR signals related to the region of the object being imaged. The third magnetic field may be perpendicular to the main magnetic field. The waveform generator 316 may generate an RF pulse. The RF pulse may be amplified by the RFPA 307, processed by the RF electronics 309, and applied to the RF coils 303 to generate the RF signals in response to a powerful current generated by the RF electronics 309 based on the amplified RF pulse.

When used as receivers, the RF coils may be responsible for detecting MR signals (e.g., echoes). After excitation, the MR signals generated by the object may be sensed by the RF coils 303. The receive amplifier then may receive the sensed MR signals from the RF coils 303, amplify the sensed MR signals, and provide the amplified MR signals to the ADC 308. The ADC 308 may transform the MR signals from analog signals to digital signals. The digital MR signals then may be sent to the processing device 240 for sampling.

In some embodiments, the main magnet 301, the gradient coils 302, and the RF coils 303 may be circumferentially positioned with respect to the object around the Z-direction. It is understood by those skilled in the art that the main magnet 301, the gradient coils 302, and the RF coils 303 may be situated in a variety of configurations around the object.

In some embodiments, the RFPA 307 may amplify an RF pulse (e.g., the power of the RF pulse, the voltage of the RF pulse) such that an amplified RF pulse is generated to drive the RF coils 303. The RFPA 307 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 307 may include a linear RFPA or a nonlinear RFPA. In some embodiments, the RFPA 307 may include one or more RFPAs.

In some embodiments, the MR system 200 may include a magnet assembly, a gradient coil assembly, and a shim assembly. The magnet assembly may be a main structure of the MR system 200. The magnet assembly may be configured to generate a main magnetic field (e.g., the main magnetic field as described with reference to FIG. 3). The gradient coil assembly may be configured to generate a gradient magnetic field (e.g., the gradient field in FIG. 3). The gradient magnetic field may be superimposed on the main magnetic field and distort the main magnetic field so that the magnetic orientations of the protons of an object (e.g., a patient) may vary as a function of their positions inside the gradient magnetic field, thereby encoding spatial information into MR signals generated by the region of the object.

In some embodiments, the magnet assembly may include a magnet (e.g., a superconducting magnet) and a cryostat. The magnet may be configured to generate the main magnetic field. The magnet may be located inside the cryostat. The cryostat may be configured to maintain the magnet in a superconducting state. The magnet may be in the superconducting state when the temperature of the magnet is maintained below a temperature (or referred to as a critical temperature) by, e.g., exposed in a low-temperature environment (e.g., 4.2 K). In some embodiments, the cryostat may be configured to cool the magnet to reduce or maintain the temperature of the magnet so as to maintain its superconducting state. In some embodiments, the cryostat may be configured to house a cooling medium for cooling the magnet. In some embodiments, the magnet may include a superconducting coil unit. The superconducting coil unit may include at least one superconducting coil. The at least one superconducting coil may be supported by a coil former.

In some embodiments, the MR system 200 may include a cooling channel and a refrigeration component. The refrigeration component may be located on the cryostat and thermally coupled to the cooling channel. In some embodiments, the refrigeration component may be attached to the cryostat and above the cryostat. In some embodiments, the refrigeration component may be located at a position of the cryostat close to a center of the cryostat. For example, a distance between a center of the refrigeration component and a cross-section of the cryostat in a midplane along an axial direction of the cryostat may be smaller than a threshold. In some embodiments, the cooling channel may house a cooling medium. The refrigeration component may be configured to cool the cooling medium. In some embodiments, the cooling channel may be located around the magnet. Heat may exchange between the magnet and the cooling medium, thereby cooling the magnet. In some embodiments, after the cooling medium is cooled by the refrigeration component, the cooling medium may flow through the cooling channel to cool the magnet. After the cooling medium is heated, the cooling medium may flow to the refrigeration component and be cooled by the refrigeration component. In some embodiments, the cooling medium may include helium, nitrogen, water, a hyperpolarization material, or the like, or any combination thereof. The cooling medium may change between a liquid state and a gaseous state while flowing in the cooling channel. For instance, the cooling medium may evaporate to a gaseous state by absorbing heat from the magnet, and condense to a liquid state when cooled at the refrigeration component. In some embodiments, the cooling channel may include a thermosiphon. The cooling medium may be housed inside the thermosiphon.

In some embodiments, the cooling channel may be made of a material of a relatively high thermal conductivity, that is, the thermal conductivity of the material may exceed a threshold, which may achieve a relatively high thermal conduction between the refrigeration component and the magnet, thereby cooling the magnet without the cooling medium. For example, the material of the cooling channel may include copper.

In some embodiments, the cryostat may include an inner vacuum shell, an inner thermal shield layer, an outer thermal shield layer, and an outer vacuum shell. The outer vacuum shell and the outer thermal shield layer may form an outer vessel. The inner vacuum shell and the inner thermal shield layer may form an inner vessel. The magnet may be housed in a space between the outer vessel and the inner vessel. In some embodiments, the space may house a vacuum environment. The inner vacuum shell, the inner thermal shield layer, the outer thermal shield layer, the outer vacuum shell, and/or the vacuum environment may be employed alone or in combination to reduce the heat transfer between the ambient and the magnet.

In some embodiments, the cryostat may include an end cover connected to the inner vessel and the outer vessel to form an enclosed space. The magnet may be housed in the enclosed space. In some embodiments, the enclosed space may house a vacuum environment.

In some embodiments, the refrigeration component may include a first stage cold head and a second stage cold head. The first stage cold head may be operably connected to a thermal shield layer (e.g., the outer thermal shield layer) to achieve a heat transfer between the first stage cold head and the thermal shield layer. The first stage cold head may be configured to cool the thermal shield layer to a specific temperature (e.g., 30-50K). The second stage cold head may be operably connected to the magnet (e.g., the at least one superconducting coil) to achieve a heat transfer between the second stage cold head and the magnet. The second stage cold head may be configured to cool the magnet to or maintain the magnet at the superconducting state.

In some embodiments, the cryostat may be of an annular structure. At least one of the inner vacuum shell, the inner thermal shield layer, the outer thermal shield layer, the outer vacuum shell, the outer vessel, or the inner vessel may also be of an annular structure. The cryostat may form a bore.

In some embodiments, the gradient coil assembly may be located inside the bore. The gradient coil assembly may include a primary coil unit. The primary coil unit may be configured to generate the gradient magnetic field. In some embodiments, the primary coil unit may also generate a stray field to which the magnet is subjected, which may cause an eddy current in the magnet. The temperature of the magnet may increase due to heat generated by the eddy current, which may cause a quench of the magnet.

In some embodiments, the gradient coil assembly may include a secondary coil unit. The secondary coil unit may separate the primary coil unit and the magnet assembly. The secondary coil unit may be located between the magnet assembly and the primary coil unit. In some embodiments, the secondary coil unit may surround the primary coil unit. The secondary coil unit may be configured to at least partially shield the stray field, reducing the eddy current in the magnet.

In some embodiments, the secondary coil unit may be integrated with the primary coil unit using an insulating material and form the gradient coil assembly of an integrated structure, which may be convenient for the installation of the gradient coil assembly. For example, the insulating material may include epoxy resin.

In some embodiments, the shim assembly may be configured to at least partially shield the stray field, reducing the eddy current in the magnet. To this end, the shim assembly may at least partially compensate for the stray field. The shim assembly may improve homogeneity of the main magnetic field. In some embodiments, the shim assembly may be located outside the gradient coil assembly. The secondary coil unit may be located between the primary coil unit and the shim assembly. A gap may exist between the secondary coil unit and the shim assembly. Compared to the existing MR system 100, the secondary coil unit may be closer to the primary coil unit, thereby improving the shielding effect with respect to the stray field towards the magnet.

During an operation of the primary coil unit, the primary coil unit may be heated, and the temperature of the gradient coil assembly may increase. Compared to the existing MR system 100, by locating the shim assembly outside the gradient coil assembly, the impact of the increased temperature on the shim assembly may be reduced, such that the shim assembly may maintain its efficiency in compensating for the inhomogeneity of the main magnetic field.

In some embodiments, the shim assembly may include a plurality of shim components and a plurality of mounting components. The plurality of shim components may be configured to at least partially shield the stray field and/or compensate for the inhomogeneity of the main magnetic field. The plurality of mounting components may be configured to support the plurality of shim components. In some embodiments, each of the plurality of mounting components may be configured to support a corresponding shim component of the plurality of shim components. In some embodiments, the mounting component may be a physical structure, such as a mounting bracket, etc. For example, the mounting component may include a guide rail. In some embodiments, the mounting component may be a non-physical structure, such as a mounting hole, etc.

In some embodiments, the shim assembly may be supported on or attached to the cryostat. In some embodiments, the plurality of mounting components may be distributed along a circumferential direction of the cryostat. Taking a mounting component and a corresponding shim component as an example, the mounting component may be supported on or attached to the cryostat. The mounting component and the cryostat may form a space for housing the corresponding shim component.

In some embodiments, the shim assembly may be located on an inner wall of the cryostat, that is, the shim assembly may be supported on or attached to an inner wall of the bore. In some embodiments, the plurality of mounting components may be distributed along a circumferential direction of the inner wall of the cryostat. Taking a mounting component and a corresponding shim component as an example, the mounting component may be attached to the inner wall of the cryostat. The mounting component and the inner wall of the cryostat may form the space for housing the corresponding shim component.

In some embodiments, the shim assembly may be located on an outer wall of the cryostat, that is, the shim assembly may be supported on or attached to the outer wall of the bore. In some embodiments, the plurality of mounting components may be distributed along a circumferential direction of the outer wall of the cryostat. Taking a mounting component and a corresponding shim component as an example, the mounting component may be attached to the outer wall of the cryostat. The mounting component and the outer wall of the cryostat may form the space for housing the corresponding shim component. In some embodiments, the cryostat may be of an annular structure. As used herein, the outer wall and the inner wall of the cryostat may refer to two sides of an inner ring of the cryostat that is closer to the gradient coil assembly than an outer ring of the cryostat. The inner wall of the cryostat may be closer to the gradient coil assembly than the outer wall of the cryostat. In some embodiments, the inner wall of the cryostat may face the gradient coil assembly, while the outer wall of the cryostat may face the magnet of the magnet assembly.

In some embodiments, the shim assembly may be located between the cryostat and the gradient coil assembly. In some embodiments, the plurality of mounting components may be attached to at least one of the cryostat or the gradient coil assembly. Taking a mounting component and a corresponding shim component as an example, the mounting component may form a space for housing the corresponding shim component, and the space may be between the cryostat and the gradient coil assembly.

In some embodiments, the shim assembly may be located on an outer surface of the gradient coil assembly, that is, the shim assembly may be supported on or attached to an outer surface of the secondary coil unit. In some embodiments, the plurality of mounting components may be distributed along a circumferential direction of the outer surface of the gradient coil assembly. Taking a mounting component and a corresponding shim component as an example, the mounting component may be located on the outer surface of the gradient coil assembly. The mounting component and the outer surface of the gradient coil assembly may form the space for housing the corresponding shim component.

In some embodiments, each of at least one of the plurality of mounting components may include a mounting bracket.

Figure 8:
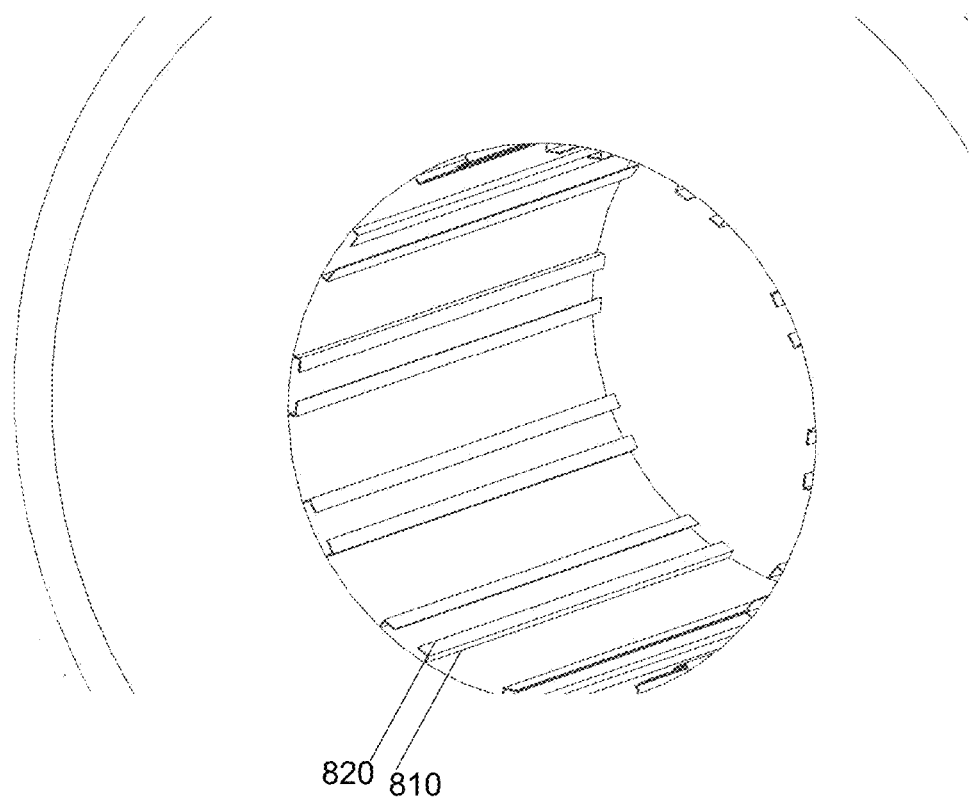
FIG. 8 is a schematic diagram illustrating an exemplary mounting bracket according to some embodiments of the present disclosure.

In some embodiments, the mounting bracket may include a connection piece (e.g., 810 in FIG. 8) and a limiting piece (e.g., 820 in FIG. 8). The connection piece may extend along an axial direction of the bore. In some embodiments, if the shim assembly is located on the inner wall of the bore, the connection piece may be connected to the inner wall of the bore. If the shim assembly is located on the outer wall of the bore, the connection piece may be connected to the outer wall of the bore. If the shim assembly is located on the outer surface of the gradient coil assembly, the connection piece may be connected to the outer surface of the gradient coil assembly.

In some embodiments, the limiting piece may be located on the connection piece. The limiting piece may be configured to form the space for housing the corresponding shim component. The limiting piece may also be configured to limit a movement of the corresponding shim component, thereby preventing the shim component from being displaced from its intended position and facilitating a stable support for the shim component. The limiting piece and the connection piece may form an angle. In some embodiments, the limiting piece may be perpendicular to the connection piece, and the angle formed by the limiting piece and the connection piece may be 90 degrees. The limiting piece and the connection piece may form an L-shape.

In some embodiments, a count of the mounting bracket of the mounting component may be non-limiting, for example, 1, 2, 3, or more. In some embodiments, the mounting component may include two mounting brackets for forming the space for mounting the corresponding shim component. In some embodiments, the two mounting brackets may be symmetrically arranged. For example, the two brackets may be symmetrically arranged on or attached to the inner wall of the bore, the outer wall of the bore, the outer surface of the gradient coil assembly, etc.

In some embodiments, each of at least one of the plurality of mounting components may include a mounting hole. If the shim assembly is located on the inner wall of the bore, the mounting hole may be located on the inner wall of the bore. If the shim assembly is located on the outer wall of the bore, the mounting hole may be located on the outer wall of the bore. If the shim assembly is located on the outer surface of the gradient coil assembly, the mounting hole may be located on the outer surface of the gradient coil assembly. In some embodiments, a plurality of mounting holes corresponding to the plurality of mounting components may be spaced along a circumferential direction of the inner wall of the bore, the outer wall of the bore, or the outer surface of the gradient coil assembly.

In some embodiments, each of at least one of the plurality of shim components may include an accommodating piece and a shim piece. The shim piece may be configured to at least partially shield the stray field and/or compensate for the inhomogeneity of the main magnetic field. The accommodating piece may be a main structure of the shim component. The accommodating piece may be configured to enclose at least a portion of the shim piece. The shim piece may be located inside the accommodating piece.

In some embodiments, the shim piece and the accommodating piece may extend along an axial direction of the bore, such that the shim piece may even the main magnetic field or the gradient magnetic field for a relatively large portion of the bore. In some embodiments, a cross-section of the shim piece and/or a cross-section of the accommodating piece may have a long-strip shape. In some embodiments, in order to improve the imaging quality of the MR system, the main magnetic field and needs to be homogenous in at least a portion of the bore (also referred to as a shim region) where an object (e.g., a patient), or a portion thereof (e.g., a region of interested) is to be placed along the axial direction of the bore. A length of the accommodating piece may be determined based on the shim region. In some embodiments, the length of the accommodating piece may be equal to or larger than a length of the shim region along the axial direction of the bore. In some embodiments, a ratio of the length of the accommodating piece to a length of the bore along the axial direction of the bore may be larger than or equal to a ratio threshold. For example, the ratio threshold may be ⅓. In some embodiments, a length of the accommodating component may be equal to or larger than a length of the shim piece along the axial direction of the bore.

In some embodiments, the shim piece may be made of a material of a high magnetic permeability, that is the magnetic permeability of the material may exceed a threshold. For example, the material of the shim piece may include a silicon steel sheet, a steel sheet, or the like, or any combination thereof. In some embodiments, the accommodating piece may be made of a non-metallic material, for example, plastic.

In some embodiments, a count of the plurality of mounting components may be determined based on a count of the shim components or a count of the shim pieces. The count of the shim components or the count of the shim pieces may be determined based on a distribution of the main magnetic field.

Figure 4A:
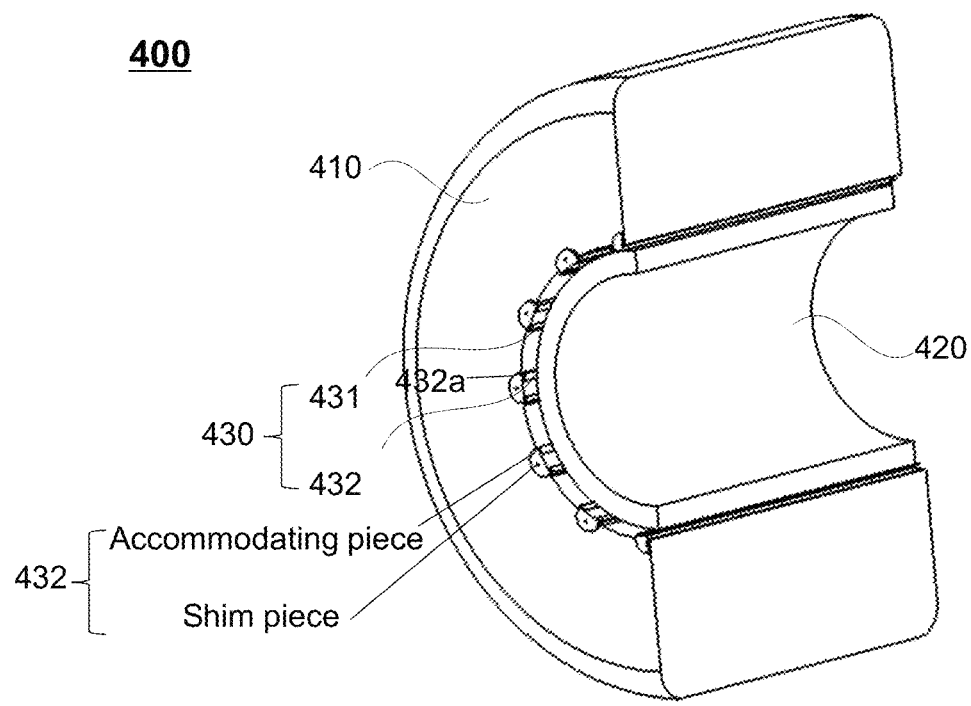
FIG. 4A is a schematic diagram illustrating an exemplary MR scanner according to some embodiments of the present disclosure.
Figure 4B:
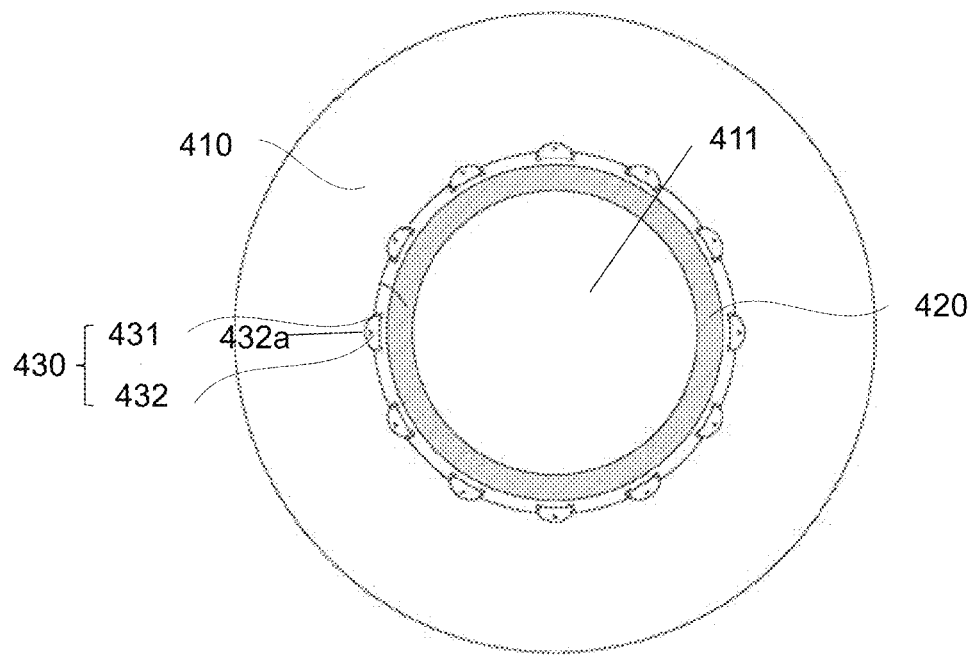
FIG. 4B is a section view of an exemplary MR scanner according to some embodiments of the present disclosure.

In some embodiments, the shim component may include a convex end (e.g., 432a as shown in FIG. 4A and FIG. 4B). The convex end may extend, along a radial direction of the bore, beyond a surface of the shim component. After the shim component is mounted on a corresponding mounting component, at least a portion of the shim component may extend out of the corresponding mounting component at the convex end of the shim component. The shim component may be replaced from the corresponding mounting component through the convex end. In some embodiments, the convex end may function as a handle of the shim component. An operator may conveniently replace the shim component from the mounting component by operating the handle. Moreover, the operator may observe whether the shim component is mounted in place through the convex end, thereby avoiding overly mounting the shim component or not mounting the shim component in place.

In some embodiments, the MR system 200 may include a magnet assembly, a cooling channel, a refrigeration component, and a shim assembly. The magnet assembly may be configured to generate a magnetic field (e.g., the main magnetic field as described with reference to FIG. 3). The magnet assembly may include a superconducting coil unit and a cryostat. The cryostat may be configured to cool the superconducting coil unit located inside the cryostat. The cryostat may form a bore. The cooling channel may be located around the superconducting coil unit. The cooling channel may be configured to accommodate a cooling medium. In some embodiments, the cooling channel may include a thermosiphon. The cooling medium may be housed inside the thermosiphon. The refrigeration component may be located on the cryostat and thermally coupled to the cooling channel. The shim assembly may be configured to at least partially shield a stray field which is generated by the gradient coil assembly and to which the magnet is subjected and/or compensate for inhomogeneity of the magnetic field. The shim assembly may be located on or outside the cryostat.

In some embodiments, the MR system 200 may include a gradient coil assembly located inside the bore. The gradient coil assembly may include a primary coil unit and a secondary coil unit. The secondary coil unit may be located between the primary coil unit and the shim assembly. A gap may exist between the secondary coil unit and the shim assembly.

In some embodiments, the MR system 200 may include a magnet assembly, a refrigeration component, a gradient coil assembly, and a shim assembly. The magnet assembly may be configured to generate a main magnetic field (e.g., the main magnetic field as described with reference to FIG. 3). The magnet assembly may include a superconducting coil unit and a cryostat. The cryostat may be configured to cool the superconducting coil unit located inside the cryostat. The cryostat may form a bore. The refrigeration component may be located on the cryostat and thermally coupled to the magnet assembly. The gradient coil assembly may be configured to generate a gradient magnetic field (e.g., the gradient field as described with reference to FIG. 3). The gradient coil assembly may be located inside the bore. The shim assembly may be configured to at least partially shield a stray field which is generated by the gradient coil assembly and to which the magnet is subjected and/or compensate for inhomogeneity of the main magnetic field. The shim assembly may be located outside the gradient coil assembly.

In some embodiments, the cryostat may include a cooling channel made of a material of a relatively high thermal conductivity; that is, the thermal conductivity of the material may exceed a threshold, which may achieve the relatively high thermal conduction between the refrigeration component and the superconducting coil unit, thereby cooling the magnet without a cooling medium. For example, the material of the cooling channel may include copper In some embodiments, the shim assembly may include a plurality of shim components distributed along a circumferential direction of the gradient coil assembly. Each of at least one of the plurality shim components may include a shim piece and an accommodating piece configured to accommodate the shim piece.

Figure 4C:
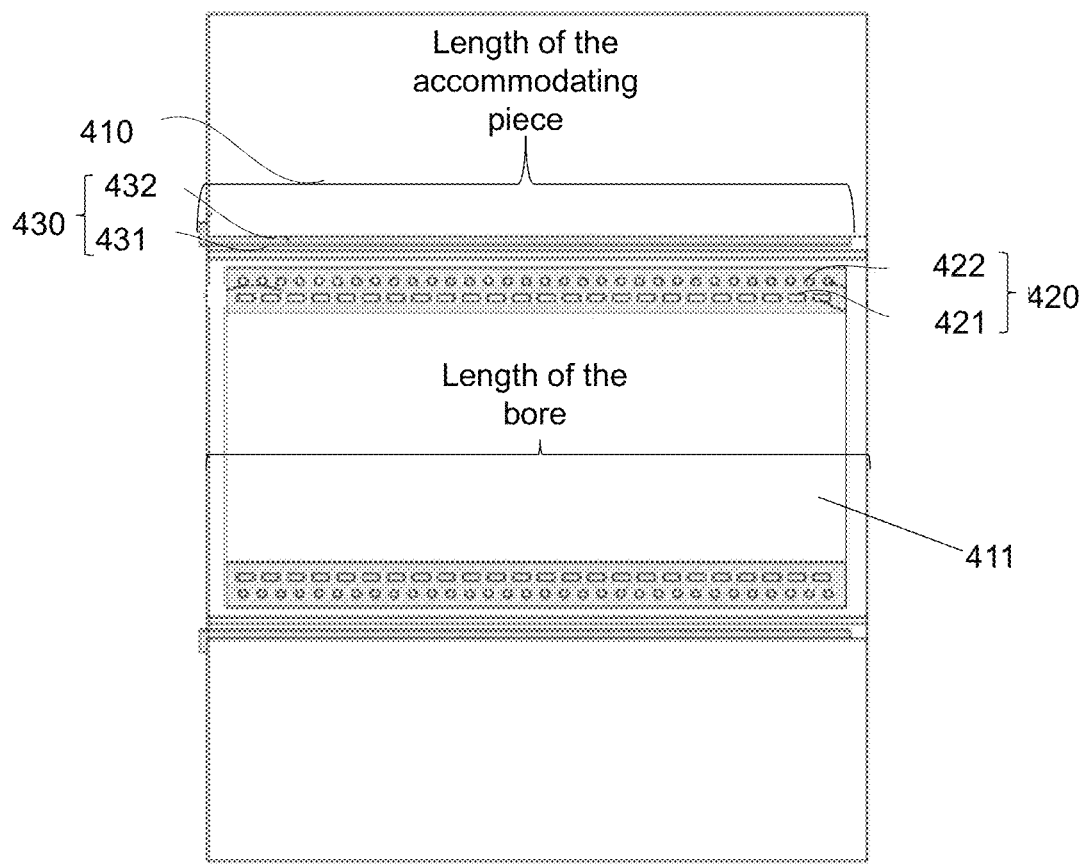
FIG. 4C is a section view of an exemplary MR scanner according to some embodiments of the present disclosure.

FIG. 4A is a schematic diagram illustrating an exemplary MR scanner according to some embodiments of the present disclosure. FIG. 4B is a section view of the exemplary MR scanner according to some embodiments of the present disclosure. FIG. 4C is a section view of the exemplary MR scanner according to some embodiments of the present disclosure.

As shown in FIGS. 4A-4C, the MR system 400 may include a magnet assembly 410, a gradient coil assembly 420, and a shim assembly 430. The magnet assembly 410 may be configured to generate a main magnetic field (e.g., the main magnet field as described with reference to FIG. 3). In some embodiments, the magnet assembly may include a magnet and a cryostat (not shown in FIGS. 4A-4C). The cryostat may be configured to cool the magnet located inside the cryostat. The cryostat may form a bore 411.

The gradient coil assembly 420 may be configured to generate a gradient magnetic field (e.g., the gradient field as described with reference to FIG. 3). The gradient coil assembly 420 may be located inside the bore 411. The gradient coil assembly 420 may include a primary coil unit 421 and a secondary coil unit 422. The primary coil unit 421 may be configured to generate the gradient magnetic field. The primary coil unit 421 may also generate a stray field to which the magnet assembly 410 is subjected, which may increase a temperature of the magnet assembly 410. The secondary coil unit 422 may be configured to shield the primary coil unit 421 so as to at least partially prevent or reduce the interference of the magnet assembly 410 by the stray field.

The shim assembly 430 may be configured to at least partially shield the stray field. To this end, the shim assembly 430 may be configured to compensate for inhomogeneity of the main magnetic field. As shown in FIGS. 4A-4C, the shim assembly 430 may be located on an inner wall of the bore 411. The shim assembly 430 may include a plurality of mounting components 431 and a plurality of shim components 432. The plurality of shim components 432 may be configured to at least partially shield the stray field and/or compensate for the inhomogeneity of the main magnetic field. The plurality of mounting components 431 may be configured to support the plurality of shim components 432. Each of the plurality of mounting components 431 may be configured to support a corresponding shim component of the plurality of shim components 432. The plurality of shim components 432 may be distributed along a circumferential direction of the inner wall of the bore 411. The plurality of mounting components 431 may be distributed along the circumferential direction of the inner wall of the bore 411.

As shown in FIG. 4A and FIG. 4B, the shim component 432 may include a convex end 432a. The convex end 432a may extend, along a radial direction of the bore 411, beyond a surface of the shim component 432. After the shim component 432 is mounted on a corresponding mounting component 431, at least a portion of the shim component 432 may extend out of the corresponding mounting component 431 at the convex end 432a of the shim component 432. The shim component 432 may be replaced from the corresponding mounting component 431 through the convex end 432a.

Figure 5A:
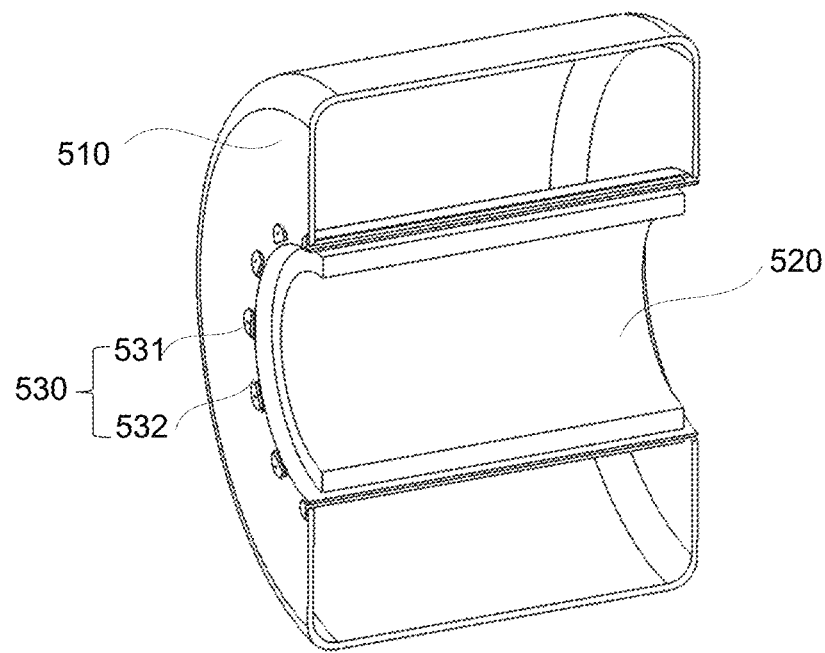
FIG. 5A is a schematic diagram illustrating an exemplary MR scanner according to some embodiments of the present disclosure.
Figure 5B:
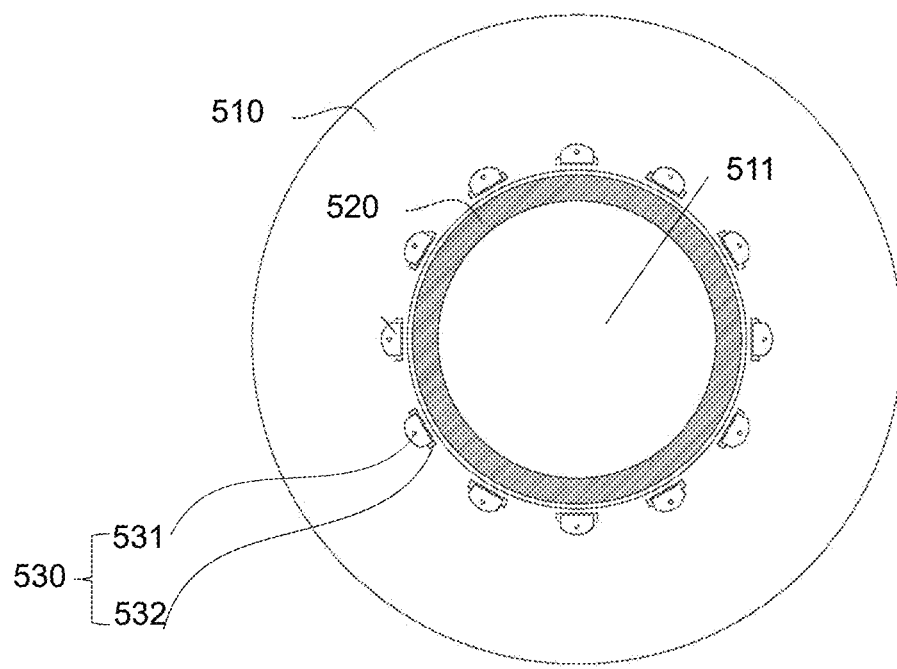
FIG. 5B is a section view of an exemplary MR scanner according to some embodiments of the present disclosure.
Figure 5C:
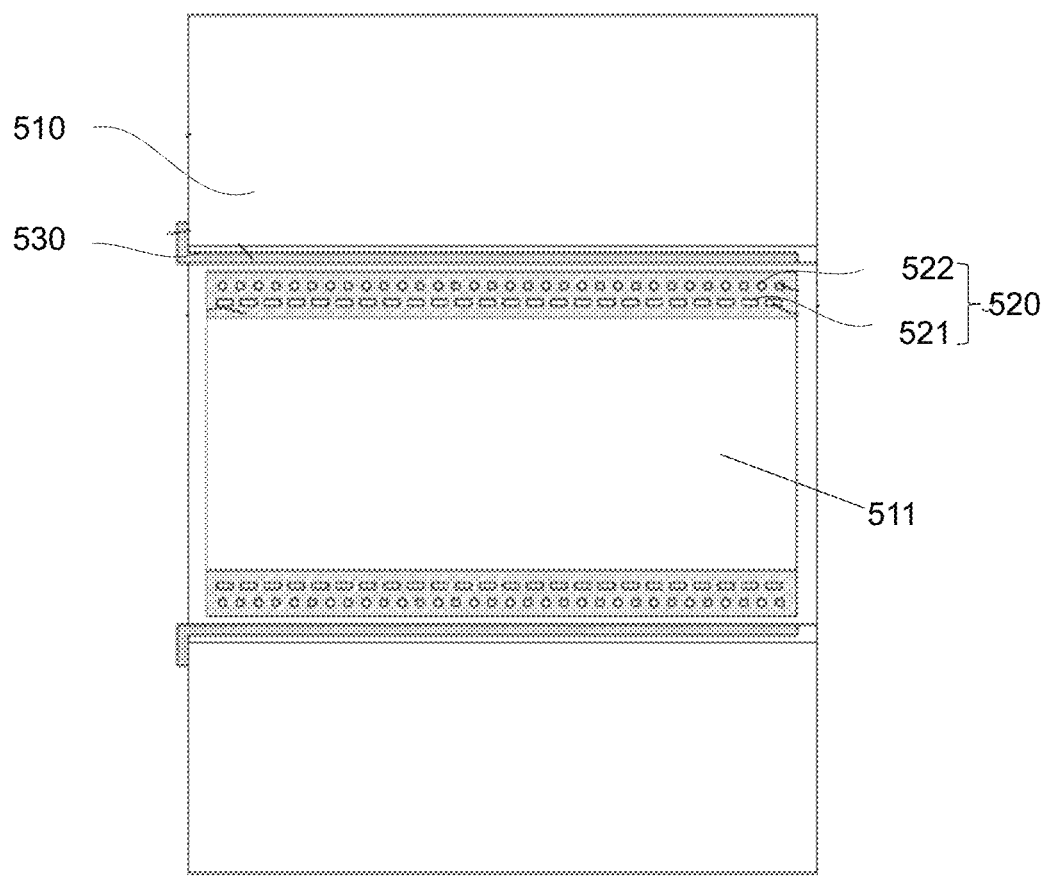
FIG. 5C is a section view of an exemplary MR scanner according to some embodiments of the present disclosure.

FIG. 5A is a schematic diagram illustrating an exemplary MR scanner according to some embodiments of the present disclosure. FIG. 5B is a section view of the exemplary MR scanner according to some embodiments of the present disclosure. FIG. 5C is a section view of the exemplary MR scanner according to some embodiments of the present disclosure.

As shown in FIGS. 5A-5C, the MR system 500 may include a magnet assembly 510, a gradient coil assembly 520, and a shim assembly 530. The magnet assembly 510 may be configured to generate a main magnetic field (e.g., the main magnet field as described with reference to FIG. 3). In some embodiments, the magnet assembly may include a magnet and a cryostat (not shown in FIGS. 5A-5C). The cryostat may be configured to cool the magnet located inside the cryostat. The cryostat may form a bore 511.

The gradient coil assembly 520 may be configured to generate a gradient magnetic field (e.g., the gradient field as described with reference to FIG. 3). The gradient coil assembly 520 may be located inside the bore 511. The gradient coil assembly 520 may include a primary coil unit 521 and a secondary coil unit 522. The primary coil unit 521 may be configured to generate the gradient magnetic field. The primary coil unit 521 may also generate a stray field to which the magnet assembly 510 is subjected, which may increase a temperature of the magnet assembly 510. The secondary coil unit may be configured to shield the primary coil unit 521 so as to at least partially prevent or reduce the interference of the magnet assembly 510 by the stray field.

The shim assembly 530 may be configured to at least partially shield the stray field and/or compensate for inhomogeneity of the main magnetic field. As shown in FIGS. 5A-5C, the shim assembly 530 may be located on an outer wall of the bore 511. The shim assembly 530 may include a plurality of mounting components 531 and a plurality of shim components 532. The plurality of shim components 532 may be configured to at least partially shield the stray field and/or compensate for the inhomogeneity of the main magnetic field. The plurality of mounting components 531 may be configured to support the plurality of shim components 532. Each of the plurality of mounting components 531 may be configured to support a corresponding shim component of the plurality of shim components 532. The plurality of shim components 532 may be distributed along a circumferential direction of the outer wall of the bore 511. The plurality of mounting components 531 may be distributed along the circumferential direction of the outer wall of the bore 511.

Figure 6:
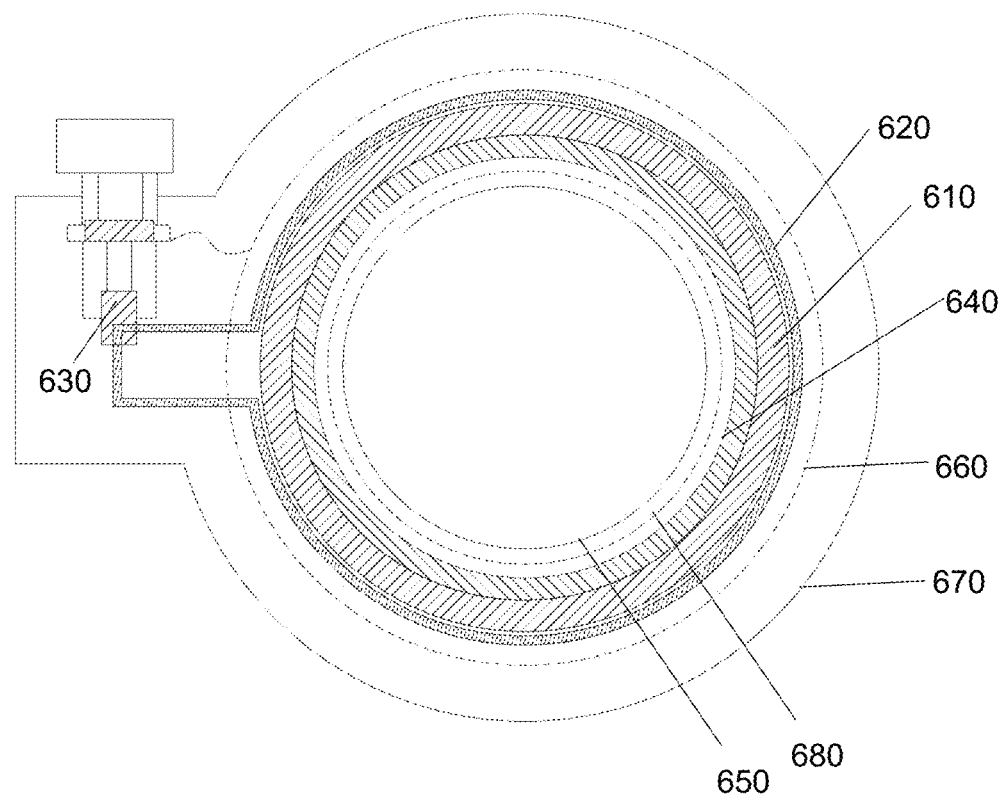
FIG. 6 is a section view of an exemplary MR scanner according to some embodiments of the present disclosure.

FIG. 6 is a section view of an exemplary MR scanner according to some embodiments of the present disclosure.

As shown in FIG. 6, the MR system 600 may include a magnet 610, a cooling channel 620, and a second stage cold head 630. The magnet 610 may be configured to generate a main magnetic field. In some embodiments, the magnet 610 may include a superconducting coil unit configured to generate a main magnetic field. The superconducting coil unit may include at least one superconducting coil. The MR system 600 may include a coil former 640 configured to support the at least one superconducting coil. In some embodiments, the second stage cold head 630 may be operably connected to the at least one superconducting coil to achieve a heat transfer between the second stage cold head 630 and the at least one superconducting coil.

As shown in FIG. 6, the second stage cold head 630 may be thermally coupled to the cooling channel 620. In some embodiments, the cooling channel 620 may house a cooling medium. In some embodiments, the cooling channel 620 may include a thermosiphon. The cooling medium may be housed in the thermosiphon. The second stage cold head 630 may be configured to cool the cooling medium. The cooling channel 620 may be located around the magnet 610. Heat may exchange between the magnet 610 and the cooling medium, thereby cooling the magnet 610. In some embodiments, after the cooling medium is cooled by the second stage cold head 630, the cooling medium may flow through the cooling channel 620 to cool the magnet 610. After the cooling medium is heated, the cooling medium may flow to the second stage cold head 630 and be cooled by the second stage cold head 630 In some embodiments, the cooling medium may include helium, nitrogen, water, a hyperpolarization material, or the like, or any combination thereof. The cooling medium may change between a liquid state and a gaseous state while flowing in the cooling channel. For instance, the cooling medium may evaporate to a gaseous state by absorbing heat from the magnet, and condense to a liquid state when cooled at the refrigeration component.

As shown in FIG. 6, the MR system 100 may also include an inner vacuum shell 650, an inner thermal shield layer 680, an outer thermal shield layer 660, and an outer vacuum shell 670. The outer vacuum shell 670 and the outer thermal shield layer 660 may form an outer vessel. The inner vacuum shell 650 and the inner thermal shield layer 680 may form an inner vessel. The magnet 610 may be housed in a space between the outer vessel and the inner vessel. In some embodiments, the space may house a vacuum environment. The inner vacuum shell 650, the inner thermal shield layer 680, the outer thermal shield layer 660, the outer vacuum shell 670, and/or the vacuum environment may be employed alone or in combination to reduce the heat transfer between the ambient and the magnet 610. In some embodiments, the magnet 610 may be located in a chamber enclosed by the outer thermal shield layer 660.

Figure 7:
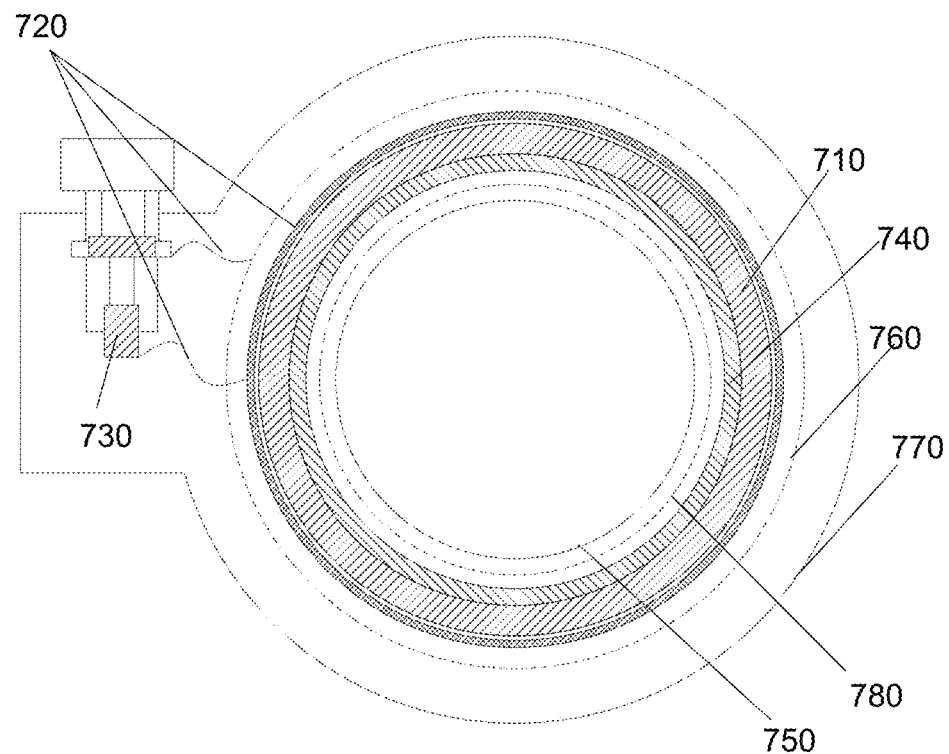
FIG. 7 is a section view of an exemplary MR scanner according to some embodiments of the present disclosure.

FIG. 7 is a section view of an exemplary MR scanner according to some embodiments of the present disclosure.

As shown in FIG. 7, the MR system 700 may include a magnet 710, a cooling channel 720, and a second stage cold head 730. The magnet 710 may be configured to generate a main magnetic field. In some embodiments, the magnet 710 may include a superconducting coil unit configured to generate a main magnetic field. The superconducting coil unit may include at least one superconducting coil. The MR system 700 may include a coil former 740 configured to support the at least one superconducting coil. In some embodiments, the second stage cold head 730 may be operably connected to the at least one superconducting coil to achieve a heat transfer between the second stage cold head 730 and the at least one superconducting coil.

The second stage cold head 730 may be thermally coupled to the cooling channel 720. In some embodiments, the cooling channel 720 may be made of a material of a relatively high thermal conductivity, that is, the thermal conductivity of the material may exceed a threshold. The cooling channel 720 may be located around the magnet 710. Heat may exchange between the magnet 710 and the material of the relatively high thermal conductivity, thereby cooling the magnet 710.

As shown in FIG. 7, the MR system 100 may also include an inner vacuum shell 750, an inner thermal shield layer 780, an outer thermal shield layer 760, and an outer vacuum shell 770. The outer vacuum shell 770 and the outer thermal shield layer 760 may form an outer vessel. The inner vacuum shell 750 and the inner thermal shield layer 780 may form an inner vessel. The magnet 710 may be housed in a space between the outer vessel and the inner vessel. In some embodiments, the space may house a vacuum environment. The inner vacuum shell 750, the inner thermal shield layer 780, the outer thermal shield layer 760, the outer vacuum shell 770, and/or the vacuum environment may be employed alone or in combination to reduce the heat transfer between the ambient and the magnet 710.

FIG. 8 is a schematic diagram illustrating an exemplary mounting bracket according to some embodiments of the present disclosure.

As shown in FIG. 8, the mounting bracket 800 may include a connection piece 810 and a limiting piece 820. The limiting piece 820 may be located on the connection piece 810. The limiting piece 820 may be configured to form a space for housing a corresponding shim component. The limiting piece 820 may also be configured to limit a movement of the corresponding shim component, thereby preventing the shim component from being displaced from its intended position and facilitating a stable support for the shim component.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate $\pm 1\%$, $\pm 5\%$, $\pm 10\%$, or $\pm 20\%$ variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A magnetic resonance (MR) system, comprising:
a magnet assembly configured to generate a main magnetic field, the magnet assembly including a magnet and a cryostat configured to cool the magnet located inside the cryostat, and the cryostat forming a bore;
a gradient coil assembly configured to generate a gradient magnetic field, the gradient coil assembly being located inside the bore; and
a shim assembly configured to at least partially shield a stray field which is generated by the gradient coil assembly and to which the magnet is subjected, the shim assembly being located outside the gradient coil assembly,
wherein
the shim assembly includes a plurality of shim components and a plurality of mounting components configured to support the plurality of shim components,
each of at least one of the plurality of shim components includes an accommodating piece and a shim piece,
the accommodating piece is configured to enclose at least a portion of the shim piece, and
a ratio of a length of the accommodating piece to a length of the bore along an axial direction of the bore is larger than or equal to a ratio threshold, the ratio threshold being $1/3$.

2. The MR system of claim 1, wherein the cryostat includes a thermal shield layer, and the magnet is located in a chamber enclosed by the thermal shield layer.

3. The MR system of claim 1, wherein the shim assembly is located on an outer wall of the cryostat.

4. The MR system of claim 1, wherein the shim assembly is located between the gradient coil assembly and the cryostat.

5. The MR system of claim 1, wherein the shim assembly is located on an outer surface of the gradient coil assembly.

6. The MR system of claim 1, wherein
the gradient coil assembly includes a primary gradient coil unit and a secondary coil unit;
the secondary coil unit is located between the primary coil unit and the shim assembly; and
a gap exists between the secondary coil unit and the shim assembly.

7. The MR system of claim 1, wherein
each of the plurality of mounting components is configured to support a corresponding shim component of the plurality of shim components.

8. The MR system of claim 7, wherein the mounting component includes a mounting hole.

9. The MR system of claim 7, wherein
the mounting component includes a mounting bracket; and
the mounting bracket and an inner wall of the bore form a space for housing the corresponding shim component.

10. The MR system of claim 9, wherein
the mounting bracket includes a connection piece extending along an axial direction of the bore and a limiting piece;
the connection piece is connected to the inner wall of the bore; and
the limiting piece is located on the connection piece, the limiting piece being configured to limit a movement of the corresponding shim component.

11. The MR system of claim 1, wherein the accommodating piece is made of a non-metallic material.

12. The MR system of claim 1, wherein the cryostat includes a thermosiphon or a material of thermal conductivity configured to cool the magnet.

13. The MR system of claim 1, wherein the MR system further includes a cooling channel located around the magnet, the cooling channel being configured to accommodate a cooling medium.

14. The MR system of claim 13, wherein the magnet is not in contact with the cooling medium in the cooling channel, and the cooling medium changes between a liquid state and a gaseous state while flowing in the cooling channel.

15. The MR system of claim 13, wherein the cooling channel includes a thermosiphon, the cooling medium being housed in the thermosiphon.

16. A magnetic resonance (MR) system, comprising:
a magnet assembly configured to generate a magnetic field, the magnet assembly comprising a superconducting coil unit and a cryostat configured to cool the superconducting coil unit located inside the cryostat, and the cryostat forming a bore;
a cooling channel located around the superconducting coil unit, the cooling channel being configured to accommodate a cooling medium;
a refrigeration component located on the cryostat and thermally coupled to the cooling channel; and
a shim assembly configured to at least partially shield a stray field which is generated by the gradient coil assembly and to which the magnet is subjected,
wherein
the shim assembly includes a plurality of shim components and a plurality of mounting components configured to support the plurality of shim components,
each of at least one of the plurality of shim components includes an accommodating piece and a shim piece,
the accommodating piece is configured to enclose at least a portion of the shim piece, and
a ratio of a length of the accommodating piece to a length of the bore along an axial direction of the bore is larger than or equal to a ratio threshold, the ratio threshold being $1/3$.

17. The MR system of claim 16, further comprising a gradient coil assembly located inside the bore, wherein
the gradient coil assembly includes a primary coil unit and a secondary coil unit;
the secondary coil unit is located between the primary coil unit and the shim assembly; and
a gap exists between the secondary coil unit and the shim assembly.

18. The MR system of claim 16, wherein the magnet is not in contact with the cooling medium in the cooling channel, and the cooling medium changes between a liquid state and a gaseous state while flowing in the cooling channel.

19. A magnetic resonance (MR) system, comprising:
a magnet assembly configured to generate a main magnetic field, the magnet assembly comprising a superconducting coil unit and a cryostat configured to cool the superconducting coil unit located inside the cryostat, and the cryostat forming a bore;
a refrigeration component located on the cryostat and thermally coupled to the magnet assembly;
a gradient coil assembly configured to generate a gradient magnetic field, the gradient coil assembly being located inside the bore; and a shim assembly configured to at least partially shield a stray field which is generated by the gradient coil assembly and to which the magnet is subjected, wherein the shim assembly is located outside the gradient coil assembly, the shim assembly includes a plurality of shim components and a plurality of mounting components configured to support the plurality of shim components, each of at least one of the plurality of shim components includes an accommodating piece and a shim piece, the accommodating piece is configured to enclose at least a portion of the shim piece, and a ratio of a length of the accommodating piece to a length of the bore along an axial direction of the bore is larger than or equal to a ratio threshold, the ratio threshold being ⅓.

20. The MR system of claim 19, wherein the plurality of shim components are distributed along a circumferential direction of the gradient coil assembly.

* * * * *